(12) United States Patent
Yun

(10) Patent No.: US 7,977,148 B2
(45) Date of Patent: Jul. 12, 2011

(54) METHOD FOR MANUFACTURING IMAGE SENSOR

(75) Inventor: Young Je Yun, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 146 days.

(21) Appl. No.: 12/340,221

(22) Filed: Dec. 19, 2008

(65) Prior Publication Data
US 2009/0170235 A1    Jul. 2, 2009

(30) Foreign Application Priority Data
Dec. 27, 2007 (KR) .................. 10-2007-0139393

(51) Int. Cl.
*H01L 31/18* (2006.01)
(52) U.S. Cl. .............. 438/98; 438/69; 257/E31.124
(58) Field of Classification Search ............ 438/98, 438/69
See application file for complete search history.

(56) References Cited

U.S. PATENT DOCUMENTS

| | | | |
|---|---|---|---|
| 7,541,256 B2 * | 6/2009 | Swain et al. | 438/401 |
| 2007/0207566 A1 * | 9/2007 | Fu et al. | 438/64 |
| 2008/0297634 A1 * | 12/2008 | Uya | 348/294 |
| 2009/0003763 A1 * | 1/2009 | Mohammed et al. | 385/14 |
| 2009/0056098 A1 * | 3/2009 | Payne | 29/428 |

* cited by examiner

*Primary Examiner* — Alexander G Ghyka
(74) *Attorney, Agent, or Firm* — The Law Offices of Andrew D. Fortney; Andrew D. Fortney; Theresa J. Mahan

(57) ABSTRACT

A method for manufacturing an image sensor includes forming a photolithography key in a scribe lane of a first substrate over which circuitry is formed in an active region. A photodiode is formed on an active region of a second substrate. The second substrate is bonded to the first substrate such that the photodiode is electrically connected to the circuitry. The photolithography key in the scribe lane of the first substrate is opened. A pattern is formed on the active region of the bonded second substrate using the opened photolithography key on/over the first substrate.

20 Claims, 2 Drawing Sheets

METHOD FOR MANUFACTURING IMAGE SENSOR

The present application claims priority under 35 U.S.C. §119 to Korean Patent Application No. 10-2007-0139393 (filed Dec. 27, 2007), which is hereby incorporated by reference in its entirety.

BACKGROUND

An image sensor is a semiconductor device for converting an optical image into an electric signal. The image sensor may be generally classified into a charge coupled device (CCD) image sensor and a complementary metal oxide silicon (CMOS) image sensor (CIS).

A CIS may include a photodiode and a MOS transistor formed in a unit pixel, and generally obtains an image by sequentially detecting electrical signals of unit pixels in a switching manner.

In a related art CIS structure, the photodiode and the transistor are horizontally arranged.

Although the related art horizontal-type CIS has addressed some of the limitations of CCD image sensors, a conventional horizontal-type CIS image sensor still has several problems.

For example, in a conventional horizontal-type CIS, a photodiode and a transistor are horizontally formed adjacent to each other on a substrate. Therefore, an additional region for forming the photodiode is required, which may decrease the fill factor and limit the possibility of resolution.

Also, in the conventional horizontal-type CIS, it is very difficult to optimize processing by concurrently forming the photodiode and the transistor.

SUMMARY

Embodiments of the present invention relate to a method for manufacturing an image sensor that integrates circuitry and a photodiode.

Embodiments of the present invention relate to a method for manufacturing an image sensor in which a first substrate over which a pattern is formed, and a second substrate, are bonded to manufacture a vertical type image sensor. Prior to bonding the first substrate and the second substrate, a photolithography alignment key formed on and/or over the first substrate is used to align the first substrate with the second substrate.

The present method generally includes the following steps: forming a photolithography key in a scribe lane of a first substrate; preparing the first substrate over which a circuitry is formed on an active region; forming a photodiode on an active region of a second substrate; bonding the second substrate to the first substrate such that the photodiode is electrically connected to the circuitry; opening the photolithography key of the scribe lane of the first substrate; and forming a pattern on the active region of the bonded second substrate using the opened photolithography key of the first substrate.

DRAWINGS

DESCRIPTION

A method for manufacturing an image sensor in accordance with embodiments will be described in detail with reference to the accompanying drawings.

Figure 1:
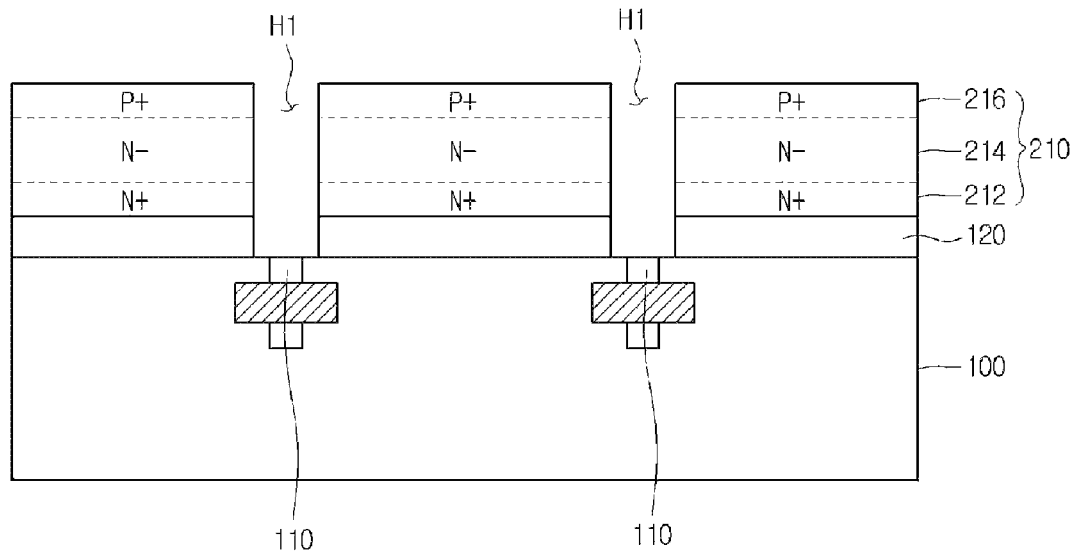
FIG. 1 illustrates a pixel region of an image sensor in accordance with exemplary embodiments of the present invention.

FIG. 1 illustrates a pixel region of an image sensor in accordance with the present method.

As illustrated in FIG. 1, an image sensor manufactured in accordance with embodiments of the present invention may include: a first substrate 100 on and/or over which circuitry (not shown) including metal interconnection 110 is formed; a dielectric layer 120 on and/or over the circuitry; and a photodiode 210 contacting the dielectric layer 120, bonded to first substrate 100, and electrically connected to the circuitry.

Photodiode 210 has a contact hole (H1) and can be electrically connected to a contact, which may be formed in the contact hole (H1).

In various embodiments, after first substrate 100 and a second substrate are bonded, a precise alignment pattern may be obtained using a photolithography key formed on and/or over the first substrate 100 so as to obtain a pattern for an active region of the second substrate. In preferred embodiments, the pattern formed on the active region of the second substrate is an active pattern.

That is, when first substrate 100 (over which a pattern is formed) and the additional second substrate are bonded to manufacture a vertical type image sensor, a photolithography alignment key that is formed on and/or over first substrate 100 may be opened, and a color filter, a probe pad or the like can be precisely aligned and formed using the photolithography alignment key.

A method for manufacturing an active region of an image sensor will now be described with reference to FIG. 1.

As illustrated in FIG. 1, a method for manufacturing an image sensor according to embodiments of the present invention may include preparing a first substrate 100 in which circuitry (not shown) including a metal interconnection 110 is formed. Although circuitry of first substrate 100 is not shown, a CIS in accordance with an exemplary embodiment can be a 4-transistor CIS. However, the invention is not limited as such. In other embodiments, the CIS may comprise 5 transistors, 3 transistors, or any other number of transistors known in the art.

The metal interconnection formed in first substrate 100 may include a metal (not shown) and/or a plug (not shown). The metal may comprise sputter-deposited aluminum or aluminum alloy (e.g., Al with up to 4 wt. % Cu, up to 2 wt. % Ti, and/or up to 1 wt. % Si), on conventional adhesion and/or barrier layers (e.g., Ti and/or TiN, such as a TiN-on-Ti bilayer), and/or covered by conventional adhesion, barrier, hillock suppression, and/or antireflective layers (e.g., Ti, TiN, WN, TiW alloy, or a combination thereof, such as a TiN-on-Ti bilayer or a TiW-on-Ti bilayer). The plug may comprise tungsten (deposited by chemical vapor deposition [CVD]) or aluminum or aluminum alloy (e.g., as described above, deposited by sputtering), on conventional adhesion and/or barrier layers (e.g., Ti and/or TiN, such as a TiN-on-Ti bilayer). The Ti, TiN and TiW layers may be deposited by CVD or sputtering.

Thereafter, a dielectric layer 120 is formed on and/or over first substrate 100 such that dielectric 120 selectively contacts the metal interconnection 110. In exemplary embodiments, the dielectric layer 120 can be, but is not limited to, an oxide layer such as $SiO_2$.

In some embodiments, the dielectric layer 120 may comprise a plurality of dielectric layers (e.g., silicon dioxide, silicon nitride, or combinations thereof). Each of the plurality of dielectric layers may correspond to the metal and/or plug of the metal interconnection. Furthermore, each dielectric layer may comprise a lowermost, conformal etch stop layer (e.g., silicon nitride), a conformal buffer and/or gap-fill layer (e.g., silicon-rich oxide [SRO], TEOS [e.g., a silicon oxide formed by CVD from tetraethyl orthosilicate and oxygen], an undoped silicate glass [USG] or a combination thereof), a bulk dielectric layer (e.g., one or more silicon oxide layers doped with fluorine [e.g., a fluorosilicate glass or FSG], boron and/or phosphorus [BSG, PSG and/or BPSG]), and a capping layer (e.g., of TEOS, USG, a plasma silane [e.g., silicon dioxide formed by plasma-assisted CVD of silicon dioxide from silane and oxygen], or a combination thereof, such as a bilayer of plasma silane on USG or TEOS, or a bilayer of USG on TEOS). A planarizing process, such as chemical mechanical polishing (CMP), may be subsequently performed on for dielectric layer 120.

The present method for manufacturing an image sensor can enhance the bonding force between the photodiode 210 and the circuitry by forming dielectric 120 between photodiode 210 and the circuitry. Also, the present method for manufacturing an image sensor can further improve bonding and cleaving states by forming dielectric on the substrate over which circuitry is formed, planarizing the dielectric through a CMP, and performing a bonding process to minimize a height difference.

Next, a crystalline semiconductor layer (not shown) is formed on and/or over the second substrate (not shown). A photodiode is formed in the crystalline semiconductor layer, so that defects in the photodiode may be prevented.

For example, the crystalline semiconductor layer may be formed by an epitaxial growth method on and/or over the second substrate. After that, hydrogen ion implantation layer may be formed by implanting hydrogen ions between the second substrate and the crystalline semiconductor layer. After that, impurity ions are implanted into the crystalline semiconductor layer to form photodiode 210.

In exemplary embodiments, a second conductive-type conduction layer 216 may be formed in an upper portion of the crystalline semiconductor layer. For example, a high concentration P-type conduction layer 216 can be formed in the upper portion of the crystalline semiconductor layer by performing a first blanket-ion implantation onto the entire surface of the second substrate without a mask. In some embodiments, the second conductive-type conduction layer 216 can be formed at a junction depth of less than about 0.5 µm.

After that, a first conductive-type conduction layer 214 is formed under second conductive-type conduction layer 216. For example, a lower concentration N-type conduction layer 214 may be formed under second conductive-type conduction layer 216 by performing a second blanket-ion implantation onto the entire surface of second substrate 200 without a mask. In one preferred embodiment, a low concentration N-type conduction layer 214 is formed at a junction depth ranging from about 1.0 µm to about 2.0 µm.

Also, embodiments may further include forming a high concentration first conductive-type conduction layer 212 under the first conductive-type conduction layer 214. In exemplary embodiments, the high concentration first conductive-type conduction layer 212 can be a high concentration N-type conduction layer, which can contribute to ohmic contact.

Next, the first substrate 100 and the second substrate are bonded such that photodiode 210 contacts the dielectric layer 120. In some embodiments, before the first substrate 100 and the second substrate are bonded to each other, the surface energy of the surface(s) to be bonded can be increased through activation by plasma.

Next, the hydrogen ion implantation layer formed in the second substrate 200 can be changed into a hydrogen gas layer by performing a heat treatment process on the second substrate. A lower portion of the second substrate can be easily removed near the hydrogen gas layer so that the photodiode 210 can be exposed.

Next, an etching process for separating photodiode 210 for each unit pixel is performed. For example, a contact hole (H1) selectively exposing metal interconnection 110 may be formed by removing a corresponding portion of photodiode 210 and dielectric 120 positioned at a boundary between pixels.

After that, a contact plug may be formed in the contact hole (H1), and then processes for forming an upper electrode (not shown) and a color filter (not shown) may be performed.

Embodiments of the present invention result in forming a precise alignment pattern using the photolithography key formed on and/or over the first substrate 100 as a pattern of the active region of the second substrate after the first substrate 100 and the second substrate are bonded to each other.

That is, in exemplary embodiments, when the first substrate 100 (over which a pattern is formed) and the second substrate are bonded to manufacture a vertical type image sensor, a photolithography alignment key formed on and/or over first substrate 100 is opened, and a color filter, a probe pad or the like can be precisely aligned and formed using the photolithography alignment key.

Hereinafter, an exemplary process for opening a photolithography key in the scribe lane of an image sensor will be described with reference to FIGS. 2 and 3.

First, photolithography key 110p is formed in the scribe lane of a first substrate 100.

After that, a second substrate 200 and the first substrate 100 are bonded to each other such that a photodiode (e.g., structure 210 of FIG. 1) of the second substrate is electrically connected to the circuitry of the first substrate 100.

Figure 2:
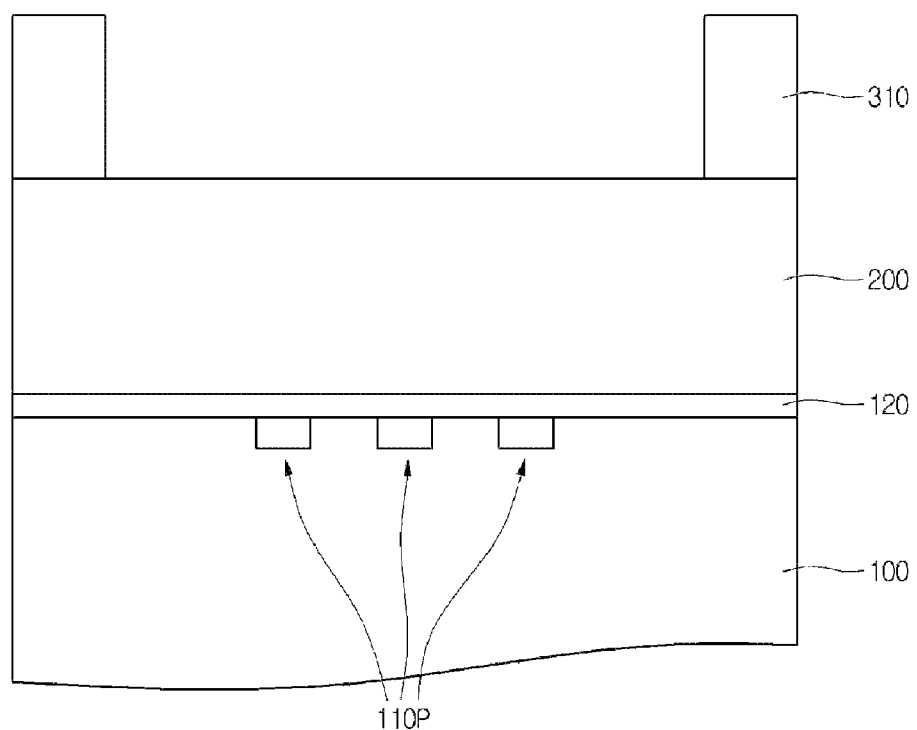
FIGS. 2 and 3 illustrate a scribe lane of an image sensor in accordance with exemplary embodiments of the present invention.

After that, as illustrated in FIG. 2, a key open pattern 310 for opening photolithography key 110p of the scribe lane of first substrate 100 is formed on the second substrate 200.

Figure 3:
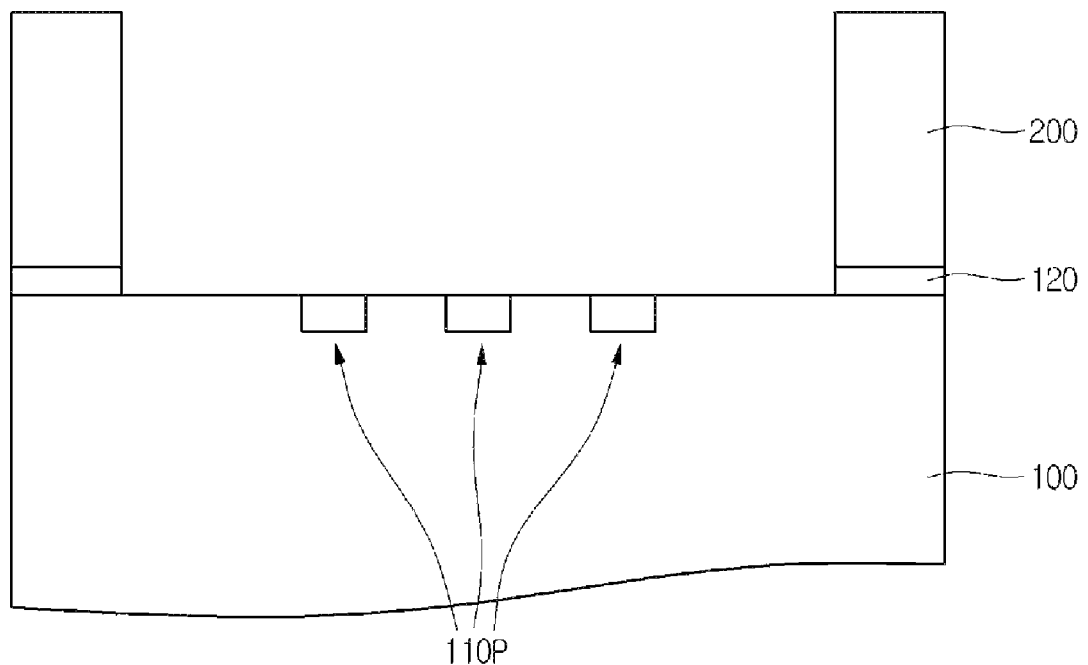

As illustrated in FIG. 3, a scribe lane of the second substrate 200 is selectively removed to open photolithography key 110p of the first substrate 100 using the key open pattern as an etch mask. When dielectric layer 120 is formed between first substrate 100 and second substrate 200, portions of the dielectric layer 120 may be selectively removed.

After that, a predetermined pattern may be formed on the active region of the bonded second substrate 200 by using opened photolithography key 110p of first substrate 100. For example, as illustrated in example FIG. 1, photodiode 210 and dielectric 120 can be selectively removed to precisely form the contact hole (H1) such that the position where metal interconnection 110 is formed is precisely exposed.

In the process of opening photolithography key 110p of first substrate 100, the scribe lane of the second substrate 200 may be selectively removed with a width range of 100-400 µm. For example, the scribe lane may be removed at a width of 300 µm but is not limited as such. In other embodiments the scribe lane may be removed at a width of 100 µm, 200 µm, 250 µm, or any other value or range of values therein.

Furthermore, in exemplary methods, the photolithography key 110p formed in first substrate 100 may be opened using a reactive ion etching (RIE).

In some embodiments, the key open pattern may be formed using a notch alignment of the first and second substrates. In such embodiments, where the pre-alignment process is performed using only a notch, the alignment equipment generally has a precision of less than 200 μm. Since second substrate 200 additively bonded on first substrate 100 forms a stacked structure, which becomes a photodiode through a subsequent process, the second substrate 200 is the portion necessary only for the pixel region.

Therefore, if the key open pattern having a width range of about 100-400 μm is formed at a position of the photolithography key in the scribe lane having a width of about 100 μm by a notch pre-alignment process, the position of the photolithography key is opened and the pixel region is not opened.

That is, the opening width of the key open pattern can be determined by a range of a sum of the precision of the alignment equipment and the width of the photolithography key.

Thus, when an etching process is performed after the key open pattern is formed, the bonded substrate is opened only at the position of the photolithography key as illustrated in FIG. 3 so that alignment can be easily performed using the photolithography key.

In accordance with the present invention, when first substrate 100 over which a pattern is formed and the additional second substrate are bonded to manufacture a vertical type image sensor, a photolithography alignment key formed on and/or over first substrate 100 is opened, and then a color filter, a probe pad or the like can be precisely aligned and formed using the opened photolithography alignment key.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
forming a photolithography alignment key in a scribe lane of a first substrate over which a metal interconnection is formed on or in an active region;
forming a photodiode on or over an active region of a second substrate;
bonding the second substrate to the first substrate such that the photodiode of the second substrate is electrically connected to the metal interconnection;
opening the photolithography alignment key on the first substrate; and
forming a contact hole on the active region of the bonded second substrate using the opened photolithography alignment key.

2. The method of claim 1, wherein opening the photolithography alignment key comprises forming a key open pattern over the second substrate.

3. The method of claim 2, wherein the second substrate has a scribe lane, and opening the photolithography alignment key comprises selectively removing the scribe lane of the second substrate using the key open pattern as an etch mask.

4. The method of claim 2, wherein forming the key open pattern is performed using a notch alignment of the first substrate and the second substrate.

5. The method of claim 3, wherein forming the key open pattern is performed using a notch alignment of the first substrate and the second substrate.

6. The method of claim 3, wherein a width of the scribe lane of the second substrate is in a range of 100-400 μm is removed.

7. The method of claim 4, wherein a width of the scribe lane of the second substrate is in a range of 100-400 μm is removed.

8. The method of claim 5, wherein a width of the scribe lane of the second substrate is in a range of 100-400 μm is removed.

9. The method of claim 1, wherein the pattern formed on the active region of the second substrate is an active pattern.

10. The method of claim 2, wherein the pattern formed on the active region of the second substrate is an active pattern.

11. The method of claim 3, wherein the pattern formed on the active region of the second substrate is an active pattern.

12. The method of claim 1, wherein the metal interconnection comprises a metal layer and/or a plug.

13. The method of claim 1, further comprising forming a dielectric layer on the first substrate contacting the metal interconnection.

14. The method of claim 13, wherein the dielectric layer comprises an oxide.

15. The method of claim 1, wherein the photodiode comprises a crystalline semiconductor layer on the second substrate.

16. The method of claim 15, wherein the crystalline semiconductor layer is formed by epitaxial growth.

17. The method of claim 15, further comprising forming a hydrogen ion implantation layer between the second substrate and the crystalline semiconductor layer.

18. The method of claim 12, wherein the contact hole electrically connects the photodiode to the plug.

19. The method of claim 1, wherein the image sensor comprises circuitry over the active region, the circuitry comprising the metal interconnection.

20. The method of claim 19, wherein the circuitry comprises a 4-transistor unit pixel of the CMOS image sensor.

* * * * *